United States Patent [19]

Nishiguchi

[11] Patent Number: 4,859,269
[45] Date of Patent: Aug. 22, 1989

[54] CHIP MOUNTING APPARATUS
[75] Inventor: Masanori Nishiguchi, Yokohama, Japan
[73] Assignee: Sumitomo Electric Industries, Ltd., Osaka, Japan
[21] Appl. No.: 237,755
[22] Filed: Aug. 29, 1988
[30] Foreign Application Priority Data
  Aug. 31, 1987 [JP] Japan ............................... 62-217522
[51] Int. Cl.[4] ............................................. B32B 31/18
[52] U.S. Cl. .................................. 156/361; 156/344; 156/584
[58] Field of Search ................. 156/64, 344, 361, 584; 250/223 R; 437/226

[56] References Cited
U.S. PATENT DOCUMENTS

| 4,372,802 | 2/1983 | Harigane et al. | 156/584 X |
| 4,466,852 | 8/1984 | Beltz et al. | 156/344 |
| 4,472,218 | 9/1984 | Avedissian et al. | 156/64 |
| 4,502,910 | 3/1985 | Voltmer et al. | 156/361 |
| 4,770,737 | 9/1988 | Seki | 156/584 |

Primary Examiner—Robert A. Dawson
Attorney, Agent, or Firm—Cushman, Darby & Cushman

[57] ABSTRACT

In a chip mounting apparatus, a plurality of chips bonded on an adhesive expand tape are mounted one by one onto a package or a printed board. The apparatus is provided with a vacuum pickup member movable in any desired direction for picking up each chip by drawing the vacuum through a suction port formed in it, a plurality of push members movable up and down for pushing up the chip from a lower surface of the tape towards the vacuum pickup member, a tape driving portion for drawing the tape downwards from a peripheral portion of the chip, and an optical sensor for detecting whether or not the tape has been separated from the peripheral portion of the chip in a state in which the chip is being pushed upwards by the push members. The push members are so controlled as to move downwards by virtue of a signal outputted from the optical sensor. The optical sensor may be replaced by a load detecting monitor for detecting a load exerting upon the push rods or tension of the tape.

3 Claims, 6 Drawing Sheets

CHIP MOUNTING APPARATUS

BACKGROUND THE INVENTION

1. Field of the Invention

The present invention relates to a chip mounting apparatus for picking up each of a large number of chips, for example, semiconductor chips, chip capacitors, chip resistors or the like bonded on an adhesive expand tape to mount it onto a package or a printed board.

2. Description of the Prior Art

In general, a large number of semiconductor elements are initially formed into a certain pattern on a semiconductor wafer and are then individually separated into generally square chips through dicing, through dicing and breaking or through scribing and breaking. Prior to subsequent die-bonding and sorting process, the separated semiconductor chips are successively transported to a chip mounting apparatus, while being bonded on an adhesive expand tape, so as to be picked up thereby one at a time. The chip mounting apparatus is provided with a vacuum pickup collet for picking up the chips one by one and a push rod or rods for pushing up each chip towards the collet. In this apparatus, the adhesive expand tape is separated from each chip by drawing the tape downwards in a state in which the chip is attracted by the collet and kept unmoved by the push rods.

Recently, each semiconductor chip tends to be formed into a large size, rendering its bonding area to be enlarged. This fact makes it more difficult to separate the tape from the chip. Because of this, the period of time required for pushing up the chip by the push rods has sometimes been prolonged. However, even if the semiconductor chips are the same in external size, the time required for separating each chip from the tape is not fixed. For example, when the semiconductor chips are each 10 mm square, the time required for the separation varies in the range of 0.5 to 15 seconds. To make the separation time constant, the longest one is required to be set as the basic period thereof. As a result, even when a certain chip is separated from the tape within a relatively short time, it is picked up by the collet upon lapse of the basic period of separation time. This is disadvantageous in that productivity is relatively low.

SUMMARY OF THE INVENTION

Accordingly, the present invention has been developed with a view to substantially eliminating the above described disadvantage inherent in the prior art chip mounting apparatus, and has for its essential object to provide an improved chip mounting apparatus which is capable of picking up a large number of chips bonded on an adhesive expand tape one by one upon lapse of respective real periods of time required for separating them from the tape.

Another important object of the present invention is to provide a chip mounting apparatus of the above described type which is simple in construction and stable in functioning, and can be readily manufactured at a low cost.

In accomplishing these and other objects, according to one preferred embodiment of the present invention, there is provided a chip mounting apparatus for mounting a plurality of chips bonded on an adhesive expand tape one by one onto a package or a printed board, said apparatus including a vacuum pickup member movable in any desired direction for picking up each chip by drawing the vacuum therethrough, a plurality of push members movable up and down for pushing up the chip from a lower surface of the ape towards the vacuum pickup member, a tape driving means for drawing the tape downwards from a peripheral portion of the chip, and a separation detecting means for detecting whether or not the tape has been separated at least from the peripheral portion of the chip in a state in which the chip is being pushed upwards by the push members.

In the chip mounting apparatus having the above described construction, the push members are so controlled as to move downwards by virtue of a signal outputted from the separation detecting means. An optical sensor means comprised of a light emitting element and a light receiving element can be employed as the separation detecting means. Alternatively, a load detecting monitor means for detecting a load exerting upon the push rods or tension of the tape may be employed as the separation detecting means.

BRIEF DESCRIPTION OF THE DRAWINGS

These and other objects and features of the present invention will become more apparent from the following description taken in conjunction with the preferred embodiment thereof with reference to the accompanying drawings, throughout which like parts are designated by like reference numerals, and in which.

DETAILED DESCRIPTION OF THE PREFERRED EMBODIMENT

Figure 1:
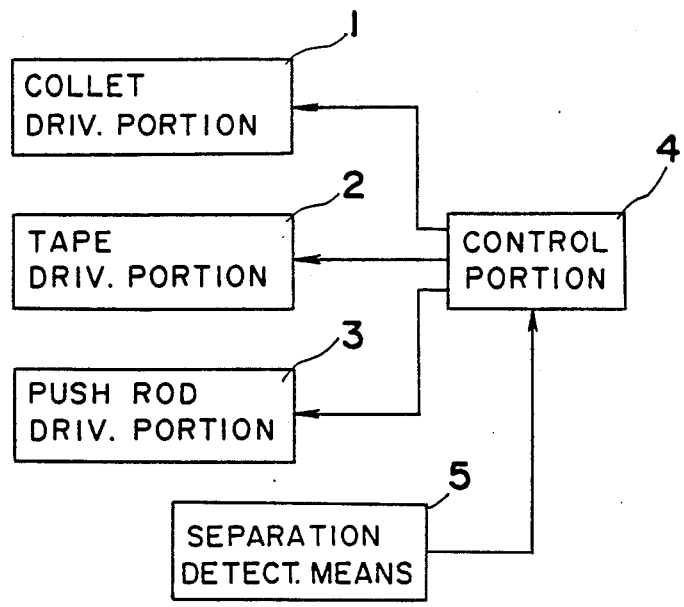
FIG. 1 is a block diagram indicative of the entire construction of a chip mounting apparatus of the present invention.

Referring first to a block diagram of FIG. 1, a chip mounting apparatus of the present invention is provided with a collet driving portion 1 for driving in any desired direction a vacuum pickup collet which can pick up a large number of chips, for example, semiconductor chips, chip capacitors, chip resistors or the like bonded on an adhesive expand tape one at a time, a tape driving portion 2 for drawing the adhesive expand tape downwards when each chip has been attracted by the collet, a push rod driving portion 3 for moving one or a plurality of push rods up and down so that the chip is caused to move up towards the collet upon upward movement of the push rods and a control portion 4 for controlling these three driving portions 1, 2 and 3. The push rod driving portion 3 includes an electric motor as a push rod driving means. The chip mounting apparatus of the present invention is further provided with a separation detecting means 5 for outputting a signal to the control portion 4 so that the push rods may be so controlled as to move downwards. Accordingly, the control portion 4 is coupled with the collet driving portion 1, the tape driving portion 2, the push rod driving portion 3 and the separation detecting means 5, as shown in the diagram of FIG. 1.

The separation detecting means 5 detects, upon downward movement of the tape, either the fact that the tape has been separated from the peripheral portion of the chip or the fact that the push rods have pierced the tape. Accordingly, the separation detecting means 5 can detect when the tape actually begins to be separated from the chip. Since the push rods are so controlled as to move downwards on the basis of a separation detecting signal outputted from the separation detecting means 5, the collet can pick up each chip upon lapse of the real time required for the separation.

FIGS. 2a to 2e depict the operation of the chip mounting apparatus according to a first embodiment of the present invention. The vacuum pickup collet 10 has at its lower surface a suction port 10a communicating with a suction means, for example, a suitable vacuum pump (not shown) so that the collet 10 can attract the chip 11 by drawing the vacuum through the suction port 10a thereof. The collet 10 is driven at least up and down by the collet driving portion 1. In this embodiment, the chip mounting apparatus is provided with a plurality of vertically movable push rods 12 disposed below the collet 10. The push rods 12 are so operable as to push up the chip 11 attracted by the collet 10 towards the collet 10 from the lower surface of the tape 13. The push rods 12 are positioned so that the peripheral portion of the chip 11 may not be in contact with the push rods 12 through the tape 13. The reason for this is not to prevent the separation, since the tape 13 begins to be separated from the chip 11 at the peripheral portion of its lower surface.

Figure 3:
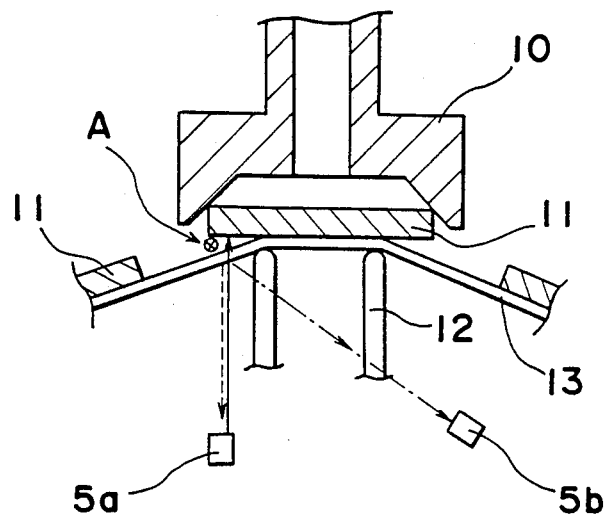
FIG. 3 is a sectional view, on an enlarged scale, indicative of the operation of a separation detecting sensor means provided in the apparatus of FIGS. 2a to 2e.

As shown in FIG. 3, the separation detecting means 5 is an optical sensor means comprised of a light emitting element 5a for emitting light towards the lower surfaces of the chip 11 and the tape 13, and a light receiving element 5b for receiving reflected light therefrom. The light emitting element 5a is so positioned as to emit light perpendicular to the peripheral portion of the lower surface of the chip 11 attracted by the collet 10. On the other hand, the light receiving element 5b is so positioned as to make a fixed acute angle with the chip 11. Accordingly, when the tape 13 is in contact with the entire lower surface of the chip 11, the light receiving element 5b never receives reflected light from the chip 11, which is shown by a dotted line in FIG. 3. In contrast, when the tape 13 begins to leave the peripheral portion of the chip 11 to make a predetermined angle with incident light, as shown by a solid line in FIG. 3, the light receiving element 5b receives reflected light from the tape 13, which is shown by a single dotted chain line in FIG. 3. Consequently, the beginning of the separation of the tape 13 from the chip 11 is detected when the light receiving element 5b has received the light emitted from the light emitting element 5a.

Figure 4:
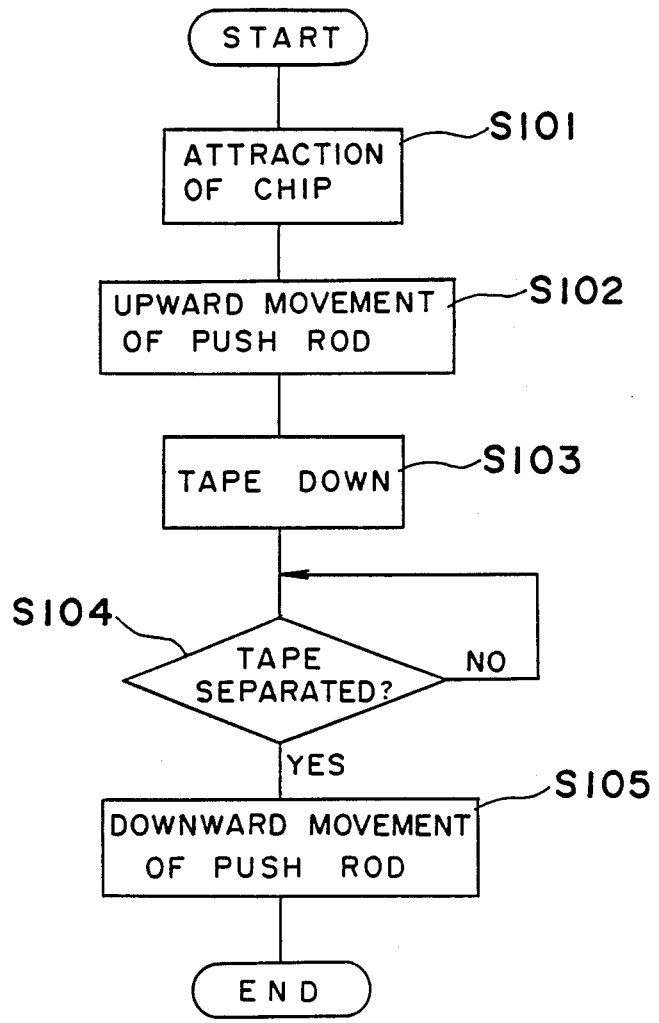
FIG. 4 is a flow-chart indicative of the operation of the apparatus of FIGS. 2a to 2e.

With reference to FIGS. 2a to 2e and a flow-chart of FIG. 4, the operation of the chip mounting apparatus will be explained hereinafter.

Figure 2A:
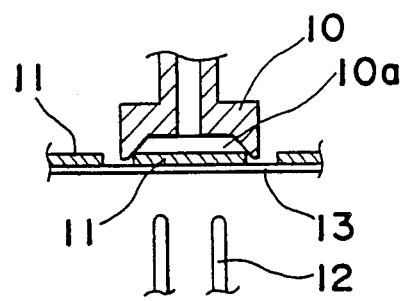
FIGS. 2a to 2e are sectional views indicative of the operation of the chip mounting apparatus according to a first embodiment of the present invention.
Figure 2B:
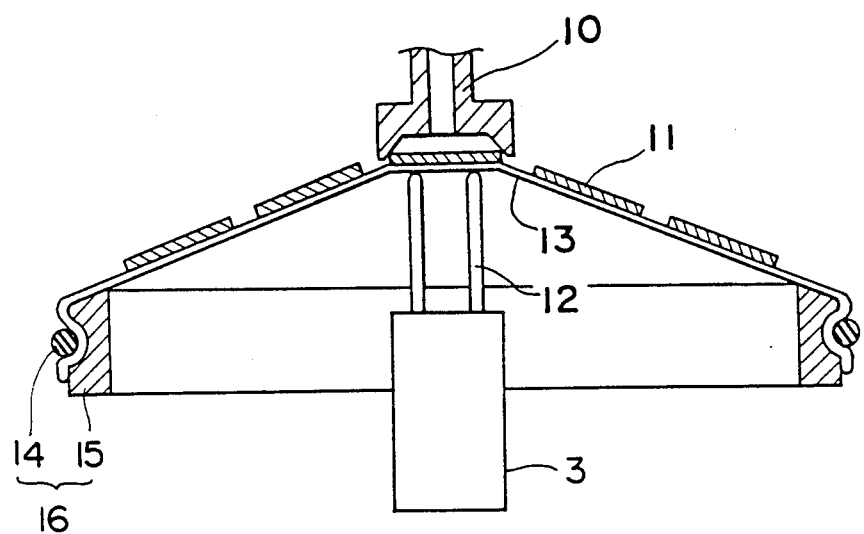
Figure 2C:
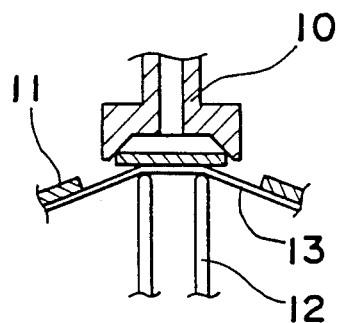

One of the chips 11 is initially supplied below the collet 10 while being bonded on the tape 13. At step s101, upon downward movement of the collet 10, the chip 11 is attracted thereby by drawing the vacuum through the suction port 10a thereof (FIG. 2a). At subsequent step s102, the push rods 12 are caused to move upwards to push up the chip 11 towards the collet 10 from the lower surface of the tape 13. In this event, the tape 13 is securely held at its peripheral portion by means of a holding means 16 of the tape driving portion 2. The holding means 16 is comprised of, for example, an aluminum ring 15 and a rubber ring 14 for pressing the peripheral portion of the tape 13 against the aluminium ring 15. Simultaneously with or immediately after the pushing up of the push rods 12, the tape driving portion 2 is brought into operation to draw the tape 13 downwards at step s103 (FIG. 2b).

Figure 2D:
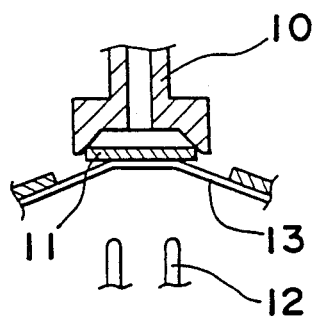

The tape 13 begins to be separated from the peripheral surface of the chip 11 by virtue of the force for drawing the tape 13 downwards. Upon separation, when the tape 13 has made a predetermined angle with the chip 11, the light receiving element 5b of the separation detecting sensor means 5 detects this fact at step s104 (FIG. 2c and FIG. 3) and outputs a signal to the control portion 4. As a result, the control portion 4 gives a command to the push rod driving portion 3 to move the push rods 12 downwards at step s105 so that the push rods 12 may move away from the tape 13 (FIG. 2d).

Figure 2E:
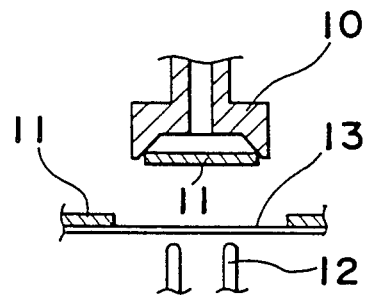

Under such conditions, since the attracting force of the collet 10 is greater than the bonding force of the tape 13, the chip 11 never departs from the collet 10 even when the tape 13 is drawn downwards. Accordingly, the tape 13 is completely separated from the chip 11, resulting in completion of the pickup of the chip 11 (FIG. 2e).

As described above, the beginning of the separation of the tape 13 from the chip 11 is detected by the separation detecting sensor means 5. Even if the separation period of time varies according to individual chips, the pickup can be completed upon lapse of real time required for the separation, rendering the pickup period of time to be shortened.

FIGS. 5a to 5e depict the construction and operation of the chip mounting apparatus according to a second embodiment of the present invention, which is provided with a plurality of sharp-pointed push rods 12a and a load detecting monitor means 17 as the separation detecting means. The load detecting monitor means 17 is electrically connected to the electric motor of the push rod driving portion 3 for detecting an electric current of the electric motor. The chip mounting apparatus of the second embodiment is substantially the same in operation as that of the first embodiment and differs therefrom in that the load detecting monitor means 17 is provided in the second embodiment. A device for detecting a load exerting upon the push rods 12a or tension of the tape 13 can be employed as the load detecting monitor means.

Figure 5A:
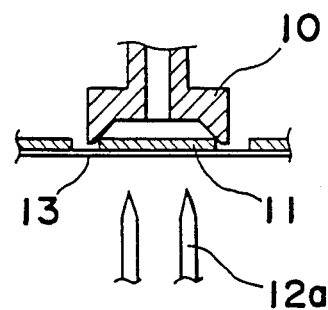
FIGS. 5a to 5e are sectional views indicative of the operation of the chip mounting apparatus according to a second embodiment of the present invention.
Figure 5B:
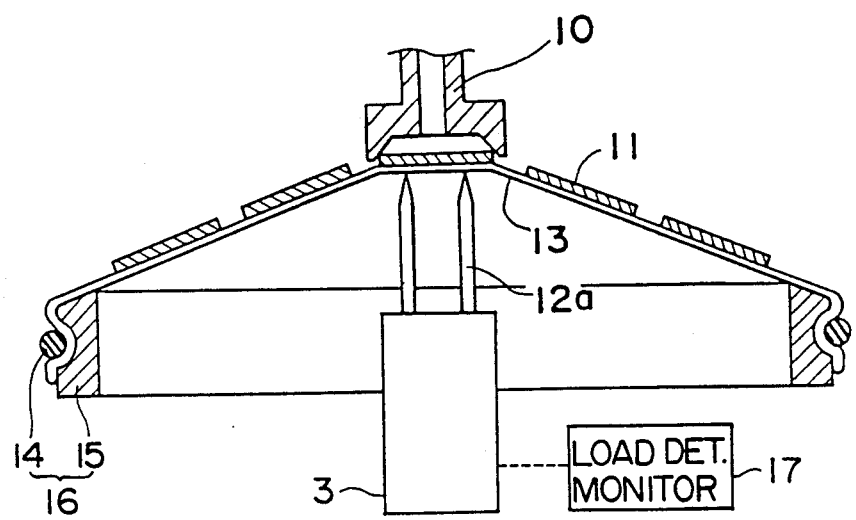
Figure 5C:
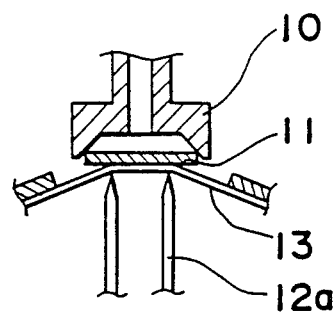
Figure 5D:
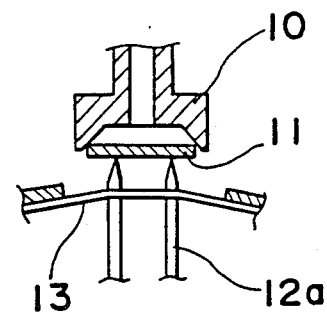
Figure 5E:
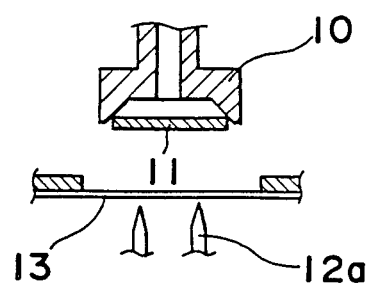

In this embodiment, when the tape 13 is drawn downwards by the tape driving portion 2 (FIG. 5c), the tape 13 begins to be separated from the peripheral portion of the chip 11 and is then pierced by the sharp-pointed push rods 12a (FIG. 5d). In this event, since the load exerting upon the push rods 12a or the tension of the tape 13 changes, the load detecting monitor means 17 can detect the separation. Thereafter, upon downward movement of the push rods 12a, the separation of the tape 13 from the chip 11 is completed (FIG. 5e).

It is to be noted here that in the first embodiment, although the light emitting and receiving elements 5a and 5b are located apart from each other, these two elements 5a and 5b may be adjacent to each other so that the light receiving element 5b can detect the reflected light shown by the dotted line in FIG. 3. If the light emitting and receiving elements 5a and 5b are located in this manner, the amount of reflected light shown by the dotted line reduces simultaneously with the separation of the tape 13.

It is also to be noted that a light beam may be caused to travel in a direction parallel to the chip 11 at a location shown by a reference character A in FIG. 3. In this case, the amount of transmitted light is detected which varies with the separation of the tape.

It is further to be noted that in the second embodiment, the fact that the push rods 12a have pierced the tape 13 may be optically detected.

From the foregoing, according to the present invention, the separation detecting means can detect the beginning of the separation of the tape from the chip, thereby rendering the push rods to stop pushing up the chip through the tape. Accordingly, the pickup of each individual chip is completed upon lapse of the real time required for the separation, thus enabling the period of time for each pickup to be effectively shortened.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A chip mounting apparatus for mounting a plurality of chips bonded on an adhesive expand tape one by one, which comprises:
    a vacuum pickup member movable in any desired direction for picking up each chip by drawing the vacuum therethrough;
    a plurality of push members movable up and down for pushing up said chip from a lower surface of said tape towards said vacuum pickup member, said push members located below said vacuum pickup member when said chip is picked up by said vacuum pickup member;
    a tape driving means for drawing said tape downwards from a peripheral portion of said chip; and
    a separation detecting means for detecting whether or not said tape has been separated at least from the peripheral portion of said chip in a state in which said chip is being pushed upwards by said push members;
    whereby said push members are so controlled as to move downwards by virtue of a signal outputted from said separation detecting means.

2. The chip mounting apparatus according to claim 1, wherein said separation detecting means comprises an optical sensor means for optically detecting the separation of said tape from said chip.

3. The chip mounting apparatus according to claim 1, wherein said separation detecting means comprises a load detecting means for detecting either of a load exerting upon said push members and tension of said tape.

* * * * *